(12) United States Patent  
Aparimarn et al.

(10) Patent No.: US 9,288,905 B2  
(45) Date of Patent: Mar. 15, 2016

(54) SHAPED INTERNAL LEADS FOR A PRINTED CIRCUIT SUBSTRATE

(71) Applicant: Seagate Technology LLC, Cupertino, CA (US)

(72) Inventors: Prapan Aparimarn, Bangkok (TH); Chaovalit Chiyatan, Bangkok (TH); Piriyakorn Jirawattanakasem, Samutprakarn (TH); Joompondej Bamrungwongtaree, Bangna Bangna (TH)

(73) Assignee: Seagate Technology LLC, Cupertino, CA (US)

( * ) Notice: Subject to any disclaimer, the term of this patent is extended or adjusted under 35 U.S.C. 154(b) by 12 days.

(21) Appl. No.: 14/076,667

(22) Filed: Nov. 11, 2013

(65) Prior Publication Data

US 2015/0129284 A1    May 14, 2015

(51) Int. Cl.
| | |
|---|---|
| *H05K 1/00* | (2006.01) |
| *H05K 1/11* | (2006.01) |
| *G11B 5/48* | (2006.01) |
| *H05K 1/05* | (2006.01) |
| *H05K 1/02* | (2006.01) |
| *H05K 3/34* | (2006.01) |

(52) U.S. Cl.  
CPC ............... *H05K 1/111* (2013.01); *H05K 1/056* (2013.01); *H05K 1/11* (2013.01); *G11B 5/486* (2013.01); *H05K 1/0296* (2013.01); *H05K 3/3436* (2013.01); *H05K 2201/09236* (2013.01); *H05K 2201/09281* (2013.01); *H05K 2201/09727* (2013.01)

(58) Field of Classification Search  
CPC .................. H05K 1/0296; H05K 1/11; H05K 2201/09281; H05K 1/056; H05K 1/0287; G11B 5/486; G11B 5/4853; G11B 5/4833; G11B 5/484  
USPC ......... 174/250–268; 360/244.1, 244.2, 245.9, 360/245.8; 361/749, 760, 777  
See application file for complete search history.

(56) References Cited

U.S. PATENT DOCUMENTS

| | | | |
|---|---|---|---|
| 3,033,914 A * | 5/1962 | Acosta-Lleras | 174/254 |
| 3,728,471 A * | 4/1973 | Blinkhorn | 174/254 |
| 4,945,395 A * | 7/1990 | Suehiro | 257/203 |
| 5,592,020 A | 1/1997 | Nakao et al. | |
| 6,493,190 B1 * | 12/2002 | Coon | 360/245.9 |
| 6,949,837 B2 | 9/2005 | Lee et al. | |
| 7,411,287 B2 | 8/2008 | Ding | |
| 7,863,737 B2 | 1/2011 | Jang et al. | |
| 2004/0238819 A1 * | 12/2004 | Maghribi et al. | 257/57 |
| 2005/0184365 A1 | 8/2005 | Lien | |
| 2011/0210442 A1 | 9/2011 | Lim et al. | |

* cited by examiner

*Primary Examiner* — Ishwarbhai B Patel  
(74) *Attorney, Agent, or Firm* — Hall Estill Attorneys at Law

(57) ABSTRACT

A printed circuit substrate may be configured with at least one internal lead designed and shaped to reduce solder bridging. The printed circuit substrate can have a plurality of internal leads that each has a continuously curvilinear boundary that defines an isolation channel. The isolation channel may be configured with a uniform distance that separates a first internal lead from an adjacent second internal lead.

21 Claims, 4 Drawing Sheets

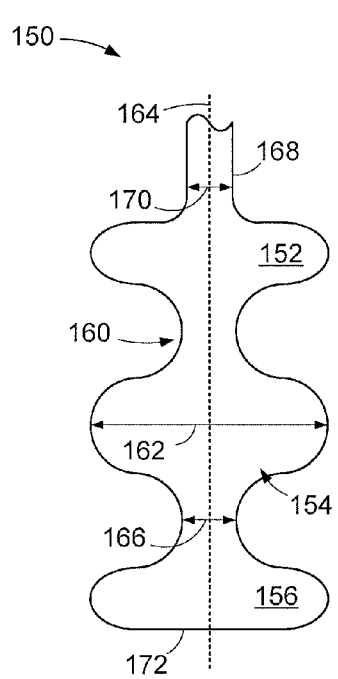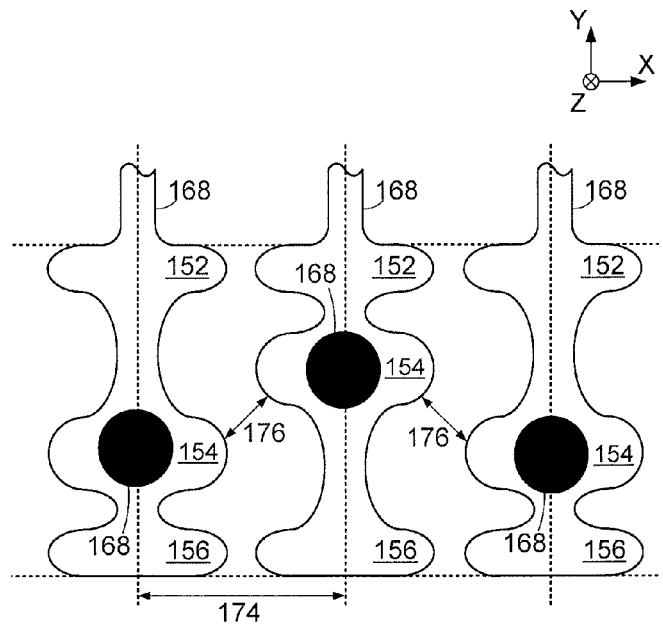
FIG. 3A  FIG. 3B
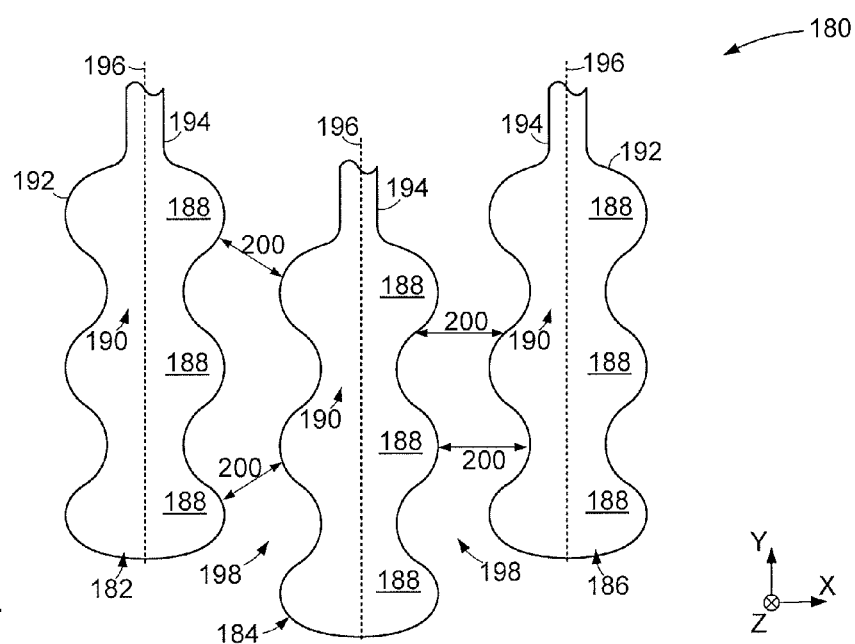
FIG. 4

SHAPED INTERNAL LEADS FOR A PRINTED CIRCUIT SUBSTRATE

SUMMARY

Various embodiments are generally directed to an electrical device configured with a printed circuit substrate that can have at least one internal lead having a continuously curvilinear boundary.

BRIEF DESCRIPTION OF THE DRAWINGS

FIGS. 3A and 3B respectively display block representations of portions of an example internal lead array configured in accordance with assorted embodiments.

FIG. 4 shows a block representation of an example internal lead array configured in accordance with some embodiments.

DETAILED DESCRIPTION

Advancing technology has heightened industry demand for decreased form factor devices capable of ever-faster data transfer rates, increased data storage capacity, and more robust data access reliability. Such demand can be accommodated by increasing the number of internal leads on a predetermined area of a printed circuit board (PCB) or printed circuit cable (PCC). However, reduction in the space between internal leads can pose a risk of solder bridging and electrical shorts after electrical connections are established on the PCB or PCC. Hence, industry has continued to strive for increased numbers of internal leads on a PCB or PCB without heightened risk of electrical shorts.

Accordingly, a printed circuit substrate may be configured with at least one internal lead that has a continuously curvilinear boundary. The continuously curvilinear boundary can allow the internal lead to be positioned a closer distance from an adjacent internal lead on the printed circuit substrate than a linear, rectangular, or partially curvilinear electrical lead without increasing the chance of solder bridging and electrical shorts forming. The ability to tune the continuously curvilinear boundary can allow for an isolation channel to have a uniform width throughout the longitudinal axis of the internal lead that reduces the possibility that an electrical connection will be formed between adjacent leads.

Figure 1:
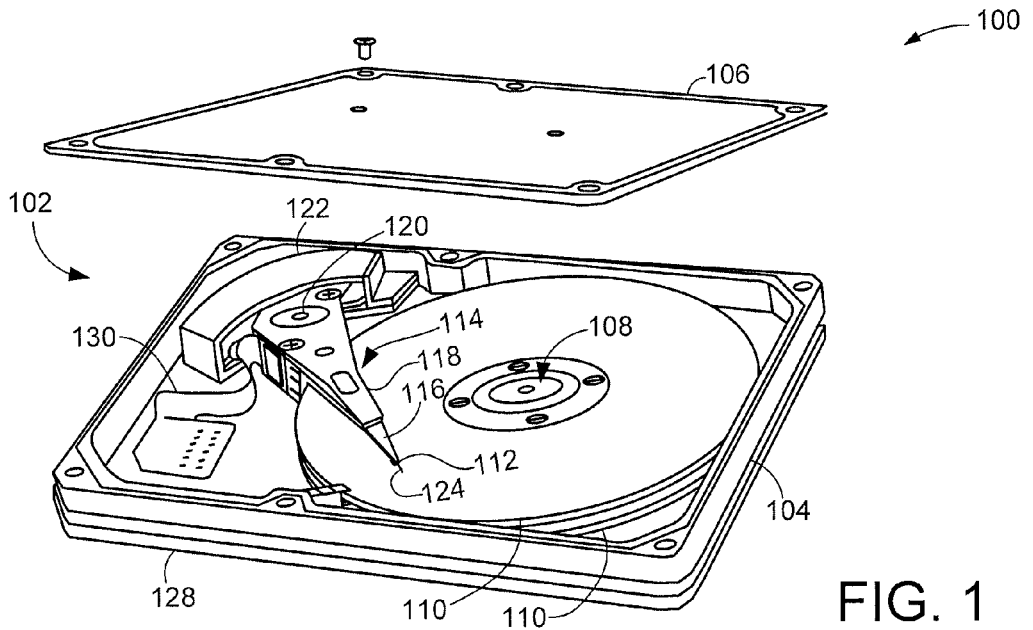
FIG. 1 is a perspective view block representation of an example data storage device configured in accordance with various embodiments.

The construction of additional internal leads can allow for the reduction in size of other electronic components attached to a PCC and/or a PCB that can be used with any electrical device, such as a hard disk drive, hybrid drive, and solid-state drive. While shaped internal leads can be employed in an unlimited number and variety of electrical devices, FIG. 1 illustrates a block representation of an example data storage device 100 as practiced in accordance with various embodiments. The device 100 can provide a sealed or unsealed chamber 102 formed from a base deck 104 and top cover 106. An internally disposed spindle motor 108 is configured to rotate a number of magnetic storage media 110. The media 110 are accessed by a corresponding array of data transducers (read/write heads) that are each supported by a head gimbal assembly (HGA) 112.

Each HGA 112 can comprise a head-stack assembly 114 ("actuator") that has a flexible suspension 116, which in turn is supported by a rigid actuator arm 118. The actuator 114 may pivot about a cartridge bearing assembly 120 through application of current to a voice coil motor (VCM) 122 to cause the transducers (numerically denoted at 124) to align with tracks (not shown) defined on the media surfaces to store data thereto or retrieve data therefrom. The data storage device 100 can also comprise a printed circuit substrate 126, such as a printed circuit board (PCB), that is connected to the transducers 124 via a printed circuit cable (PCC) 128 to facilitate the operation of the data storage device 100.

Figure 2:
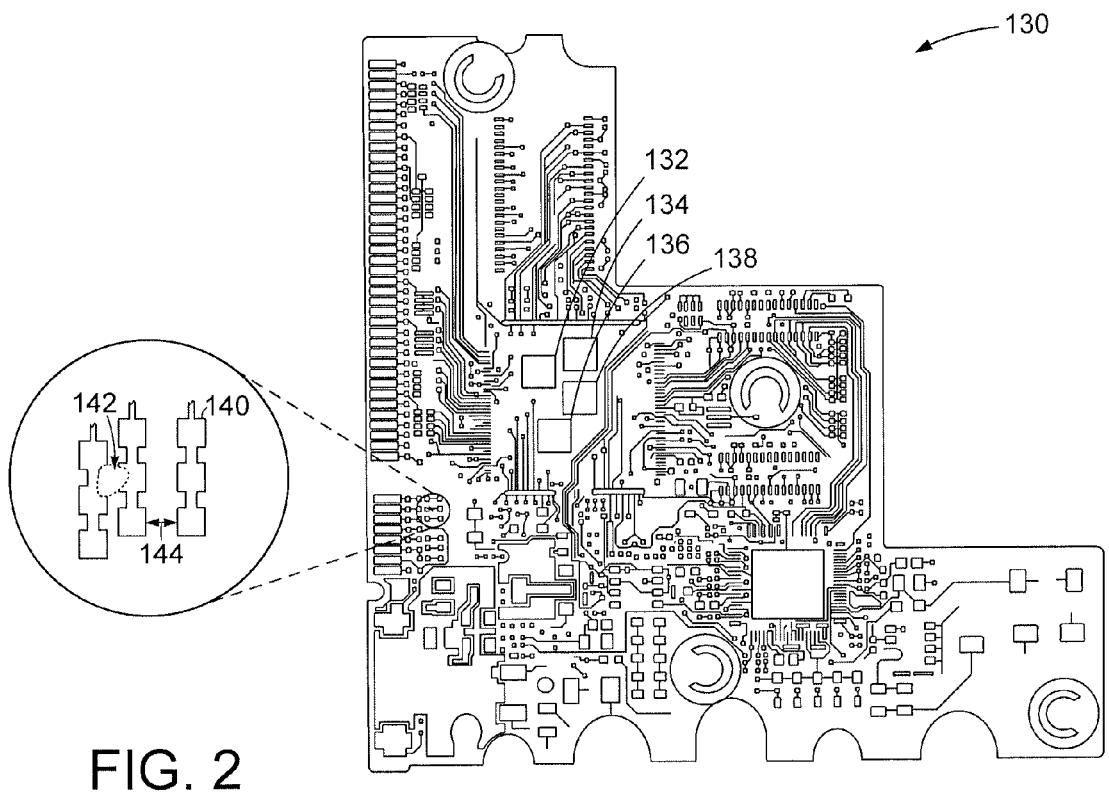
FIG. 2 illustrates a block representation of an example printed circuit board that may be used in the data storage device of FIG. 1.

FIG. 2 displays top view block representation of an example printed circuit board 130 that is capable of being used in the data storage device 100 of FIG. 1. The functions of an electronic device, such as the data storage device 100, can be controlled by hardware of at least one printed circuit board 130, such as an application specific integrated circuit (ASIC) controller 132, a memory buffer 134, a servo motor control logic 136, and a read channel signal processor 138. The various hardware may be electrically connected to one another and to other external components via leads 140 that have one or more bond pads configured to facilitate the formation of an electrical contact, like a solder ball that is reflowed into a hardened electrical conduit.

The printed circuit board 130 is not limited to a particular configuration, function, or number of electrical leads. For example, the printed circuit board 130 an employ numerous individual chips with independent functions, individual chips with multiple functions, or a single package having multiple functions either alone or in combination with one another. The increasing number of constituent board components and functions has emphasized the number of leads 140 present and available for electrical connection.

However, a reduction in lead 140 size or proximity to one another can increase the risk of inadvertent electrical connections between adjacent leads 140, such as solder bridge 142 shown between vertically offset leads. In other words, constructing the printed circuit board 130 with laterally aligned leads having a separation pitch 144 between bonding pads can inefficiently utilize space, but reducing the separation pitch either by offsetting the leads, as shown by the left two leads 140, or positioning the leads closer together can produce unwanted solder bridging 142 that interconnects two or more leads 140. It is noted that the linear sidewalls of the leads can contribute to solder bridging conditions 142 as the distance between leads 140 is minimized.

With these issues in mind, a printed circuit board may employ shaped internal leads that allow increased number of leads to be incorporated onto the board without raising the risk of inadvertent solder bridging 142 during formation of electrical connections with the respective leads 140. FIGS. 3A and 3B respectively display top view block representations of portions of an example internal lead array 150 as constructed operated in accordance with various embodiments. As shown in FIG. 3A, an internal lead 150 can be configured with first 152, second 154, and third 156 bonding areas that are each defined by continuously curvilinear sidewall boundaries 158 and connected via lead channels 160.

While not required or limiting, the bonding areas 152, 154, and 156 each have a common width 162, as measured orthogonal to the Y and longitudinal 164 axes of the lead 150. The common width 162 can be tuned to be greater than the lead channel width 166 and to provide greater surface area for the respective bonding areas 152, 154, and 156. The ability to tune the bonding area width 162 can extend to tuning the bonding areas 152, 154, and 156 to have different surface areas, as shown by the second bonding area 154 having a greater surface area than the first 152 and third 156 bonding areas, which have the same surface area.

Tuning of the internal lead 150 is not limited to the bonding areas 152, 154, and 156 as the lead channels 160 and wire 168 can be tuned for length, along the longitudinal axis 164, and width 166 and 170, respectively, to provide characteristics that optimize lead 150 operation. For instance, the lead channel width 166 can be tuned to be larger than the wire width 170, but smaller than the bonding area width 162 to allow for increased surface area for solder interconnection. Various embodiments may further tune the internal lead 150 to provide a linear boundary 172 that connects the continuously curvilinear sidewalls 168 that define the lateral extent of each bonding area 152, 154, and 156. Such linear boundary 172 may allow an increased number of electrical leads 150 or components to be positioned on a printed circuit substrate, such as PCB or PCC.

FIG. 3B illustrates how the second bonding area 154 can be tuned for vertical position along the Y axis and longitudinal axis 164 of the internal lead to allow a smaller lead pitch 174 distance between adjacent internal leads on a common printed circuit substrate. The ability to tune the continuously curvilinear sidewall boundaries of adjacent internal leads can decrease the isolation distance 176 between the internal lead boundaries along with the lead pitch 174 without increasing the risk of electrical short conditions, like solder bridging. In the non-limiting embodiment of FIG. 3B, the second bonding area 154 of each internal lead is sized to accommodate an electrical connection 178 formed in a zig-zag pattern along the X axis via a solder reflow operation with minimal risk of solder bridging due to the vertical offset spacing of the second bonding areas 154 and the tuned isolation distance 176.

While the first 152 and third 156 bonding areas have a smaller surface area than the second bonding area 154, various embodiments can tune the size, position, and presence of an electrical connection 178 for each bonding area of each internal lead to interconnect to any number of external electrical components. FIG. 4 displays a top view block representation of an example internal lead array 180 tuned in accordance with assorted embodiments to provide numerous bonding arrangements. The array 190 illustrates how first 182, second 184, and third 186 leads can be tuned to provide multiple bonding areas 188 connected by lead channels 190 and defined by continuously curvilinear boundary that extends throughout the circumference of each lead except for a linear wire 194 connection along the longitudinal axis 196.

Despite the reduced width of the lead channels 190 compared to the bonding areas 188, the curvilinear boundary 192 can be tuned, as shown, to produce an isolation channel 198 between each lead pair. It is contemplated that the isolation channels 198 can be similar or dissimilar shapes and sizes within the array 180 due to the tuned configuration of the bonding areas 188 and boundaries 192 of the respective leads 182, 184, and 186. In yet, various embodiments configure each isolation channel 198 of the array 180 with electrically insulating material, such a printed circuit substrate material, and a uniform separation distance 200 between each lead pair.

Such a uniform separation distance 200 can be measured along the X axis, perpendicular to the longitudinal axis 196 of each lead, and angled with respect to the longitudinal axis 196, as displayed. The uniform sized space between leads provided by the isolation channels 198 can allow the leads 182, 184, and 186 to be positioned in the vertically offset zig-zag pattern shown in FIG. 4 and a minimum lead pitch, such as 16 mils (0.406 mm) or less, to be utilized without jeopardizing solider bridging as solder has the uniform distance 200 to travel to create a bridge. The zig-zag pattern internal lead configuration of array 180 illustrates how similarly shaped leads 182, 184, and 186 can be utilized to increase the density of the array 180 without increasing the risk of electrical shorts.

Figure 5:
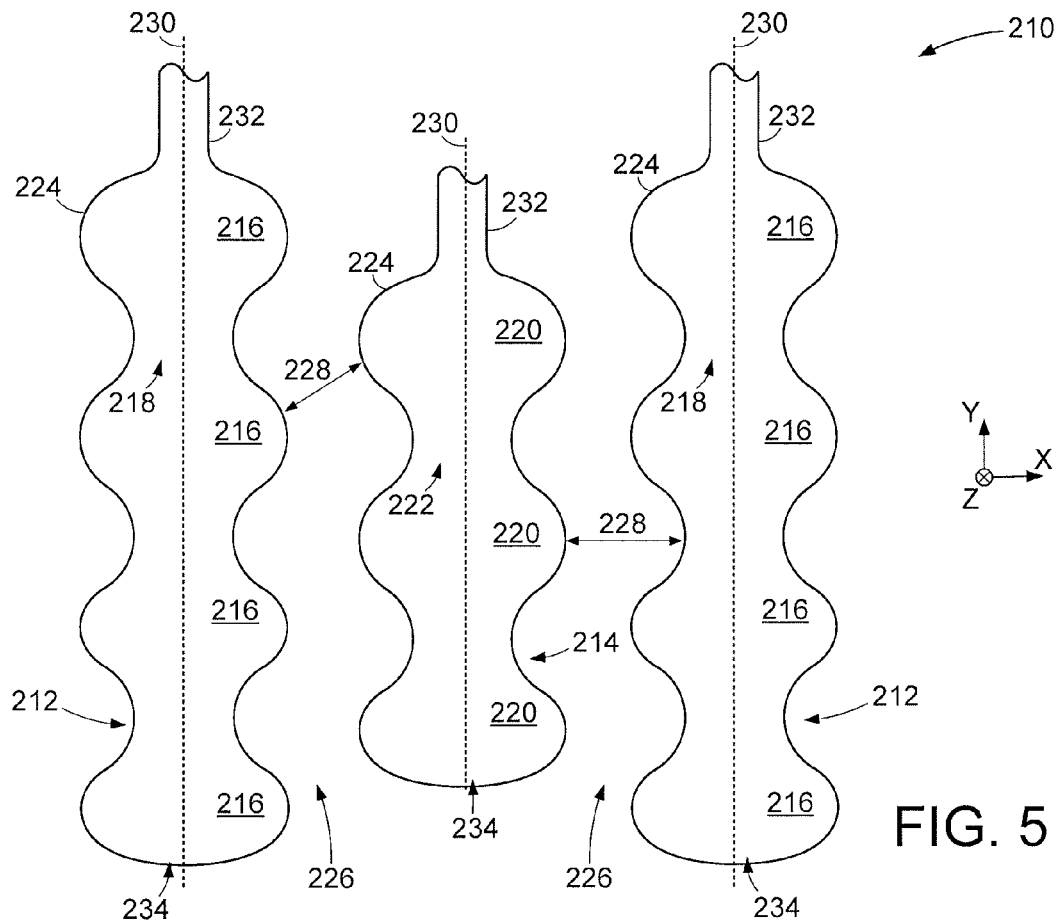
FIG. 5 provides a top view block representation of an example internal lead array constructed and operated in accordance with various embodiments.

The example internal lead array 210, displayed as a top view block representation in FIG. 5, illustrates how dissimilarly shaped leads 212 and 214 can be concurrently used in accordance with some embodiments to provide increased numbers of bonding areas without jeopardizing the formation of electrical shorting conditions. Internal leads 212 each have four bonding areas 216 connected by reduced width lead channels 218 while internal lead 214 has three bonding areas 220 connected via reduced width lead channels 222. The continuously curvilinear boundary 224 configuration of each internal lead 212 and 214 corresponds with isolation channels 226 having a uniform isolation distance 228 throughout the longitudinal axis 230 of each lead 212 and 214 from the lead wire 232 to the lead tip 234.

The ability to configure at least one internal leads with more or less bonding areas than other internal leads of an array allows for the array 210 to be customized to diverse varieties of electrical connections with optimized usage of printed circuit substrate space and risk of inadvertent solder bridging conditions. The ability to provide increased numbers of bonding areas 216 and 220 allows the array 210 to more efficiently and accurately form electrical connections than if multiple electrical connections were formed on a single bonding area.

Figure 6:
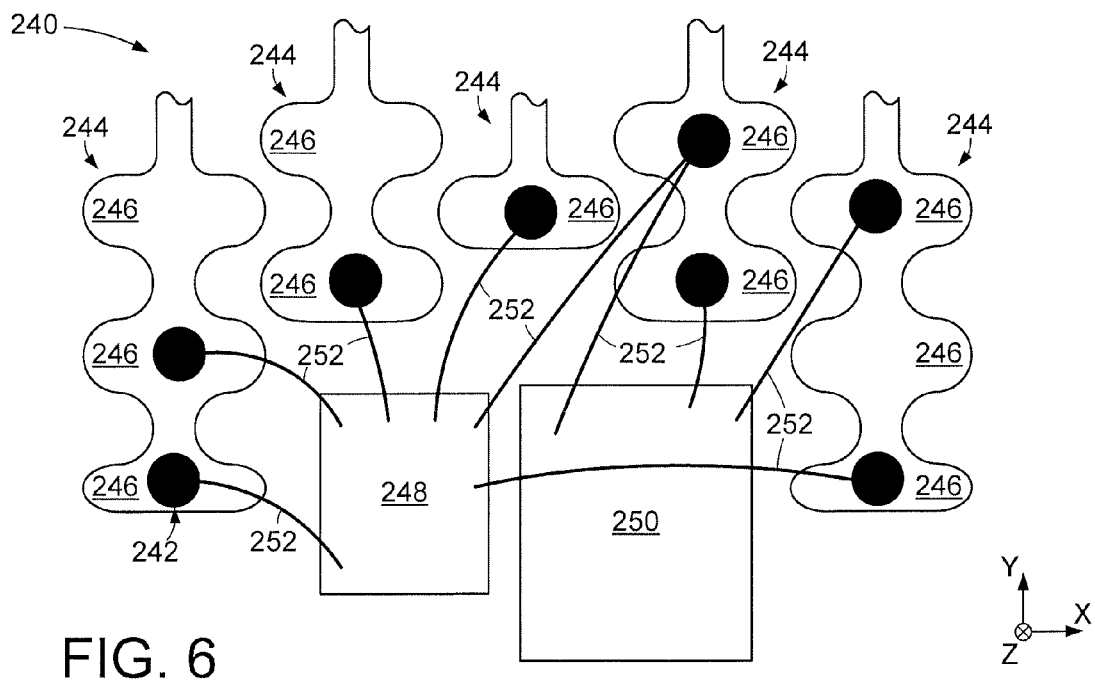
FIG. 6 illustrates a top view block representation of an example internal lead array configured in accordance with assorted embodiments.

FIG. 6 is a top view block representation of a portion of an example internal lead array 240 as constructed and operated in accordance with assorted embodiments. The internal lead array 240 illustrates how the various internal leads can be tuned for shape to provide an optimized number of bonding areas that allow electrical connections 242 to be formed efficiently and accurately. As shown, the internal lead array 240 is tuned to have internal leads 244 having different numbers of bonding areas 246. The internal leads 244 are positioned in a predetermined pattern that allows components 248 and 250, such as a resistor, capacitor, and processor, to be positioned within the areal extent of the array 240 and to be connected to various bonding areas 246 via electrical wires 252. That is, array 140 has an areal extent that can be defined as the length along the Y axis and the width along the X axis of all the internal leads 244, which can encompass both electrically conductive and non-conductive material.

The position and configuration of the respective internal leads 244 and bonding areas 246 can be tuned to facilitate efficient pathways for the electric wires 252 to the respective components 248 and 250 with minimal or no wire overlap, which can corresponds with inadvertent electrical shorts as well as increased manufacturing time and complexity. It can be appreciated that while a number of bonding areas 246 are available, electrical connections 242 may be made to less than all the areas 246 for an unlimited number of reasons, such as inductance of the internal lead 244, size of the electrical connection 242, and position of bonding areas 246 on a printed circuit substrate.

Figure 7:
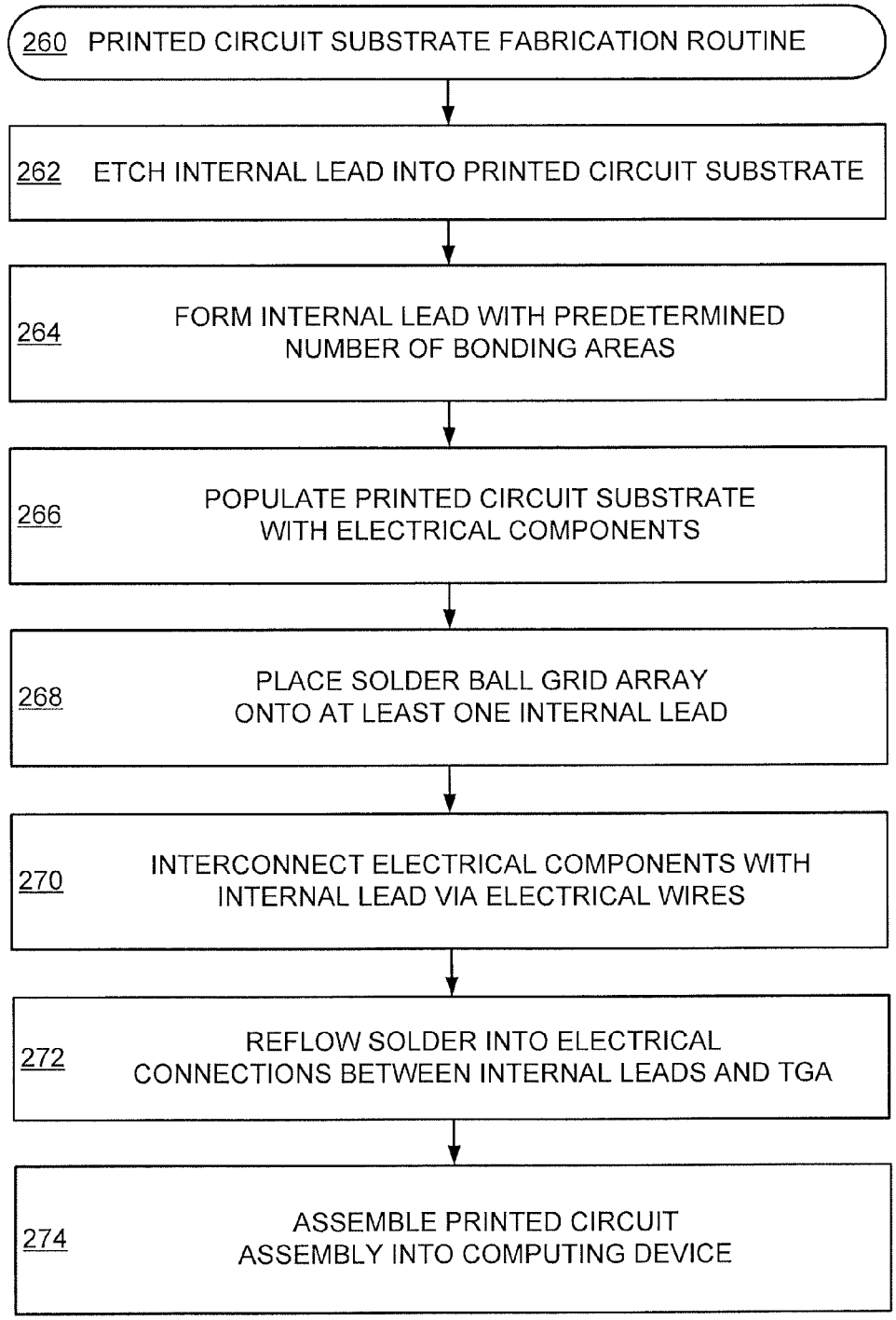
FIG. 7 is a flowchart for an example printed circuit substrate fabrication routine that may carry out in accordance with some embodiments.

FIG. 7 is a flowchart of an example printed circuit substrate fabrication routine 260 that may be carried out in accordance with various embodiments. The routine 260 may begin by providing a printed circuit substrate, such as a circuit cable or circuit board, which is subsequently processed to form a notched recess in the shape of one or more internal leads. In the non-limiting embodiment shown in FIG. 7, the substrate is etched in step 262, but other processes like lapping and molding may also be used to form the position, size, and shape of at least one internal lead. The formation of the internal lead recess allows step 264 to then form at least one internal lead with a predetermined number of bonding pads, as dictated by the shape of the recess constructed in step 262. Step 264 may form the various bonding areas consecutively, concurrently, and wholly to allow efficient construction.

Next, step 266 populates the printed circuit substrate with at least one electrical component, such as a processor. Some embodiments populate the electrical component in a different assembly to which the printed circuit substrate connects, such as a printed circuit cable connecting to a printed circuit board comprising the populated electrical component. Regardless of the number, size, and position of the electrical component populated in step 266, step 268 subsequently places at least one solder ball onto one or more bonding areas of at least one internal lead to prepare the bonding area and internal lead for a bonded electrical connection. The term solder ball is not limiting as a piece of partially or completely solid solder of any size and shape can be placed directly in contact with or be aligned above various bonding areas of assorted internal leads to satisfy step 268.

While step 268 can organize a plurality of solder balls in a grid array that places the solder in contact with respective bonding areas simultaneously, the grid array is not required as solder balls can be placed individually in various embodiments, such as by a pick-and-place machine. The placement of solder onto at least one bonding area in step 268 can trigger step 270 to next interconnect the bonding area with predetermined regions of the printed circuit substrate via electrical wires. It should be noted that the electrical wires of step 270 are not limited to pre-formed wires as solder traces may be constructed to function as electrical wires within the bounds of the present disclosure.

The electrical wires constructed and placed in step 270 can then be secured to the respective bonding areas and internal leads in step 272 with the reflowing of the solder into electrical connections between at least one internal lead and a trace gimbal assembly (TGA), such as a TGA tail of a flexure of an actuating assembly like actuator 114 of FIG. 1. Such reflowing operations may place additional solder material and may operate to form a hardened, electrically conductive connection between the bonding area and the electrical wire. It is contemplated that the reflowing of step 272 is conducted for some or all of the printed circuit substrate concurrently, such as with wave and hot bar soldering.

The hardened electrically conductive connections can facilitate complete operation of the printed circuit substrate and enable step 274 to assemble the printed circuit assembly into a computing device, such as a rotating data storage device. Through the various steps of routine 260, the size, shape, and electrical connections of various internal leads can be tuned to optimize space and operation on the printed circuit substrate. However, routine 260 is not limited to the steps shown in FIG. 7 as any steps and decisions can be added, removed, and changed at will. For example, a decision may be added to routine 260 that determines if the printed circuit substrate is to be a rigid printed circuit board or a flexible printed circuit cable.

The ability to tune an internal lead of a printed circuit substrate for shape allows any number of bonding areas to be formed with predetermined widths, surface areas, and curvilinear boundaries to optimize the formation of electrical connections to one or more of the bonding pads. Tuning the continuously curvilinear boundary of more than one internal lead further allows for the vertically offset position of a pair of internal leads and the establishment of an isolation channel having a uniform separation distance. Such isolation channel can increase the density of internal leads on the printed circuit substrate without increasing the risk of solder bridging conditions that arise from solder flowing into contact with adjacent internal leads. It is to be understood that even though numerous characteristics and configurations of various embodiments have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed. For example, the particular elements may vary depending on the particular application without departing from the spirit and scope of the present disclosure.

What is claimed is:

1. An apparatus comprising a printed circuit substrate comprising an internal lead with first, second, and third bonding areas each having a continuously curvilinear boundary and aligned along a common axis, the second bonding area having a greater surface area than the respective first and third bonding areas, the second bonding area positioned closer to the third bonding area than the first bonding area.

2. The apparatus of claim 1, wherein the second bonding area is connected to the first bonding area via a first lead channel and to the third bonding area via a second lead channel.

3. The apparatus of claim 2, wherein each lead channel has a smaller width than the respective bonding regions of the internal lead.

4. The apparatus of claim 2, wherein the first bonding pad has a greater surface area than the respective first and second lead channels.

5. The apparatus of claim 1, wherein the continuously curvilinear boundary comprises a sidewall of the internal lead.

6. The apparatus of claim 1, wherein the continuously curvilinear boundary comprises the entirety of the internal lead.

7. The apparatus of claim 1, wherein a first and third bonding pads of the internal lead have the same surface area.

8. An electrical device comprising a printed circuit substrate comprising first and second internal leads, each internal lead having a continuously curvilinear boundary defining an isolation channel and first, second, and third bonding areas aligned along a common axis, the isolation channel positioned between the first and second internal leads and having a first isolation distance separating the third bonding areas of the first and second internal leads and a second isolation distance separating the second bonding areas of the first and second internal leads, the first separation distance being smaller than the second separation distance, the second bonding area of each internal lead having a greater surface area than the respective first and third bonding areas, the second bonding area of each internal lead positioned closer to the third bonding area than the first bonding area.

9. The electrical device of claim 8, wherein at least the first bonding area of each internal lead is laterally aligned along a lateral axis oriented perpendicular to the common axis.

10. The electrical device of claim 8, wherein the printed circuit substrate is a printed circuit cable.

11. The electrical device of claim 8, wherein the printed circuit substrate is a printed circuit board.

12. An apparatus comprising a printed circuit substrate comprising a first internal lead with first, second, and third bonding areas each having a continuously curvilinear boundary and aligned along a common axis, the second bonding area positioned between the first and third bonding areas and having a greater surface area than the respective first and third bonding areas, the second bonding area positioned closer to the third bonding area than the first bonding area.

13. The apparatus of claim 12, wherein the first, second, and third bonding areas are individually and collectively symmetrical about a longitudinal axis of the first internal lead.

14. The apparatus of claim 12, wherein the first, second, and third bonding areas have a first width, as measured perpendicular to a longitudinal axis of the first internal lead.

15. The apparatus of claim 14, wherein a first lead channel connects the first and second bonding areas and a second lead channel connects the second and third bonding areas, each lead channel being symmetrical about the longitudinal axis of the first internal lead.

16. The apparatus of claim 12, wherein the first and third bonding areas each have a common surface area.

17. The apparatus of claim 12, wherein a second internal lead is positioned proximal the first internal lead, the second internal lead comprising a fourth bonding pad positioned between fifth and sixth bonding pads, the fourth bonding pad having a greater surface area than the fifth or sixth bonding area.

18. The apparatus of claim 17, wherein the first and fifth bonding pads are laterally aligned along a first dimension and the third and sixth bonding pads are laterally aligned along a second dimension, the first and second dimensions each being perpendicular to a longitudinal axis of the first internal lead.

19. The apparatus of claim 18, wherein the second and fourth bonding pads are offset from one another along the longitudinal axis of the first internal lead.

20. The apparatus of claim 19, wherein a first isolation distance between the second and fourth bonding pads is greater than a second isolation distance between the first and fifth bonding pads.

21. The apparatus of claim 17, wherein the first and second internal leads are each asymmetric about an axis perpendicular to a longitudinal axis of the first internal lead.

\* \* \* \* \*